United States Patent
Cong et al.

(10) Patent No.: US 8,394,724 B2
(45) Date of Patent: Mar. 12, 2013

(54) PROCESSING WITH REDUCED LINE END SHORTENING RATIO

(75) Inventors: Hai Cong, Singapore (SG); Wei Loong Loh, Singapore (SG); Krishan Gopal, Singapore (SG); Xin Zhang, Singapore (SG); Mei Sheng Zhou, Singapore (SG); Pradeep Ramachandramurthy Yelehanka, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 451 days.

(21) Appl. No.: 11/843,629

(22) Filed: Aug. 22, 2007

(65) Prior Publication Data

US 2008/0054477 A1 Mar. 6, 2008

Related U.S. Application Data

(60) Provisional application No. 60/824,078, filed on Aug. 31, 2006.

(51) Int. Cl.
*H01L 21/312* (2006.01)
(52) U.S. Cl. ........ 438/725; 438/694; 438/717; 438/738; 438/794; 257/E21.249; 257/E21.256
(58) Field of Classification Search .................. 438/197, 438/585, 636, 706, 694, 717, 725, 738, 794; 257/E21.249, E21.256
See application file for complete search history.

(56) References Cited

U.S. PATENT DOCUMENTS

| | | | | |
|---|---|---|---|---|
| 5,223,914 A | * | 6/1993 | Auda et al. | 356/630 |
| 6,794,279 B1 | * | 9/2004 | Stephen et al. | 438/585 |
| 6,852,584 B1 | * | 2/2005 | Chen et al. | 438/197 |
| 7,081,413 B2 | * | 7/2006 | Chan et al. | 438/706 |
| 2002/0160628 A1 | * | 10/2002 | Okoroanyanwu et al. | 438/795 |
| 2005/0164459 A1 | * | 7/2005 | Young | 438/303 |
| 2005/0191832 A1 | * | 9/2005 | Huang et al. | 438/585 |
| 2006/0063364 A1 | * | 3/2006 | Stephens et al. | 438/585 |
| 2006/0154185 A1 | * | 7/2006 | Ho et al. | 430/330 |
| 2006/0154487 A1 | * | 7/2006 | Wang et al. | 438/714 |
| 2006/0223305 A1 | * | 10/2006 | Jones et al. | 438/636 |
| 2007/0056926 A1 | * | 3/2007 | Ko | 216/67 |
| 2007/0148837 A1 | * | 6/2007 | Shah et al. | 438/164 |
| 2007/0218661 A1 | * | 9/2007 | Shroff et al. | 438/510 |

OTHER PUBLICATIONS

K.M. Tan et al., Direct Trim Etching Process of Si/SiO2 Gate Stacks using 193 nm ArF Patterns, Journal of Vacuum Science & Technology A: Vacuum, Surfaces, and Films, Jul./Aug. 2004, vol. 22, Issue 4, pp. 1500-1505.

* cited by examiner

*Primary Examiner* — Minchul Yang
(74) *Attorney, Agent, or Firm* — Horizon IP Pte. Ltd.

(57) ABSTRACT

A method for forming device features with reduced line end shortening (LES) includes trimming the device feature to achieve the desired sub-ground rule critical dimension during the etch to form the device feature.

17 Claims, 4 Drawing Sheets

PROCESSING WITH REDUCED LINE END SHORTENING RATIO

FIELD OF THE INVENTION

The present invention relates generally to semiconductor processing, and more particularly to a method for forming device features with reduced line end shortening (LES).

BACKGROUND OF THE INVENTION

To achieve feature sizes that are smaller than the lithographic ground rule, a process known as resist trimming is used. For example, to achieve transistor gate length smaller than ground rule, the patterned resist mask can be trimmed to reduce the critical dimension (CD) of the polysilicon line to the target dimension. However, conventional resist trimming processes cause the polysilicon line end to pull back much more than do its sides.

The distance by which the photoresist line ends is shortened as compared to the reduction in line width is referred to as the line end shortening (LES) ratio. The LES ratio is typically >1.5 to 2. However, such a high LES ratio is not tolerable for some devices, such as SRAM ICs, particularly in light of shrinking device dimensions coupled with increased density. As shown in FIGS. 1-2, high LES ratio can result in transistor leakage. FIG. 1 shows a portion of a substrate of an IC 100. Line end pull back can result in the ends of polysilicon gates 210, 212 of adjacent transistors 220, 222 (as shown in FIG. 2) to fall on an active region 240 of the substrate at location A, instead of on the field region 260. This results in current leakage, as represented by the dotted line in FIG. 1, between the transistors.

To reduce LES, the use of a silicon nitride or silicon oxynitride hard mask to pattern polysilicon gates has been proposed. Hard mask processes, however, besides contributing to higher costs and lower product yields, may be incompatible with some processes. For example, removal of the hard mask after etching is completed may cause erosion of a silicon nitride liner used in shallow trench isolations (STIs) due to lack of etch selectivity, forming divots at the edges of the STIs. This can lead to device leakage, impacting performance and reliability. Additionally, the use of hard masks increases cost as well as making defect control more difficult.

SUMMARY OF THE INVENTION

The present invention relates to a process for forming device features with reduced line end shortening (LES). In accordance with one aspect of the invention, a method for reducing LES includes providing a substrate prepared with a device layer or layers of a gate conductor formed thereon with a patterned resist layer disposed above the device layer or layers of the gate conductor. The method further comprises partially trimming the resist layer to produce resist dimensions less than desired dimensions and patterning the device layer or layers of the gate conductor using the partially trimmed resist layer as a mask. The step of patterning the device layer or layers of the gate conductor trims the device layer or the layers to produce a patterned device layer or a patterned gate conductor with reduced LES ratio.

In yet another aspect of the invention, a semiconductor device with reduced LES ratio is disclosed. The semiconductor device comprises a substrate and a gate conductor disposed on the substrate. The gate conductor includes first and second sides forming a width W and first and second ends forming a length L, wherein the gate conductor comprises a LES ratio of less than 1.5.

DETAILED DESCRIPTION OF THE INVENTION

The present invention relates to semiconductor processing. More particularly, the present invention provides a process for forming patterned line features with reduced line end shortening. In one embodiment, the line feature comprises polysilicon lines which serve, for example, as gate conductors. Forming other types of line features is also contemplated and within the scope of the invention, particularly where low LES ratio is desirable.

In accordance with one embodiment of the invention, forming a line feature with sub-ground rule dimensions can be achieved as part of the etch that forms the line feature. The etch can include an initial etch with appropriate etch chemistry which substantially produces the feature based on a patterned resist mask and an over-etch to complete the patterning of the feature, wherein the initial etch uses an appropriate etch chemistry to trim the line feature to desired dimensions. By trimming the line feature as part of the etch that forms the line feature, LES is substantially reduced.

Figure 1:
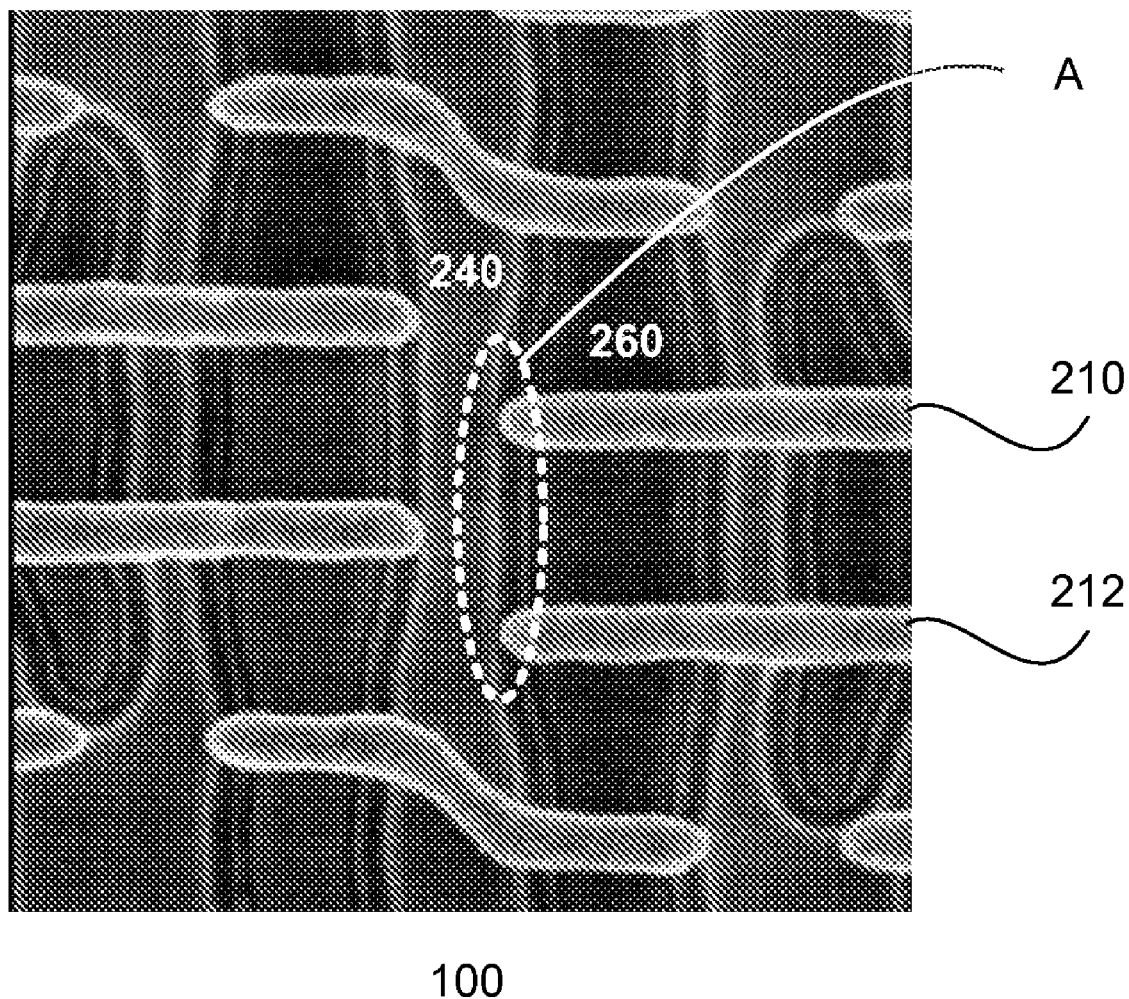
FIGS. 1-2 show gate polysilicon line end pull back (LES) after gate patterning.
Figure 2:
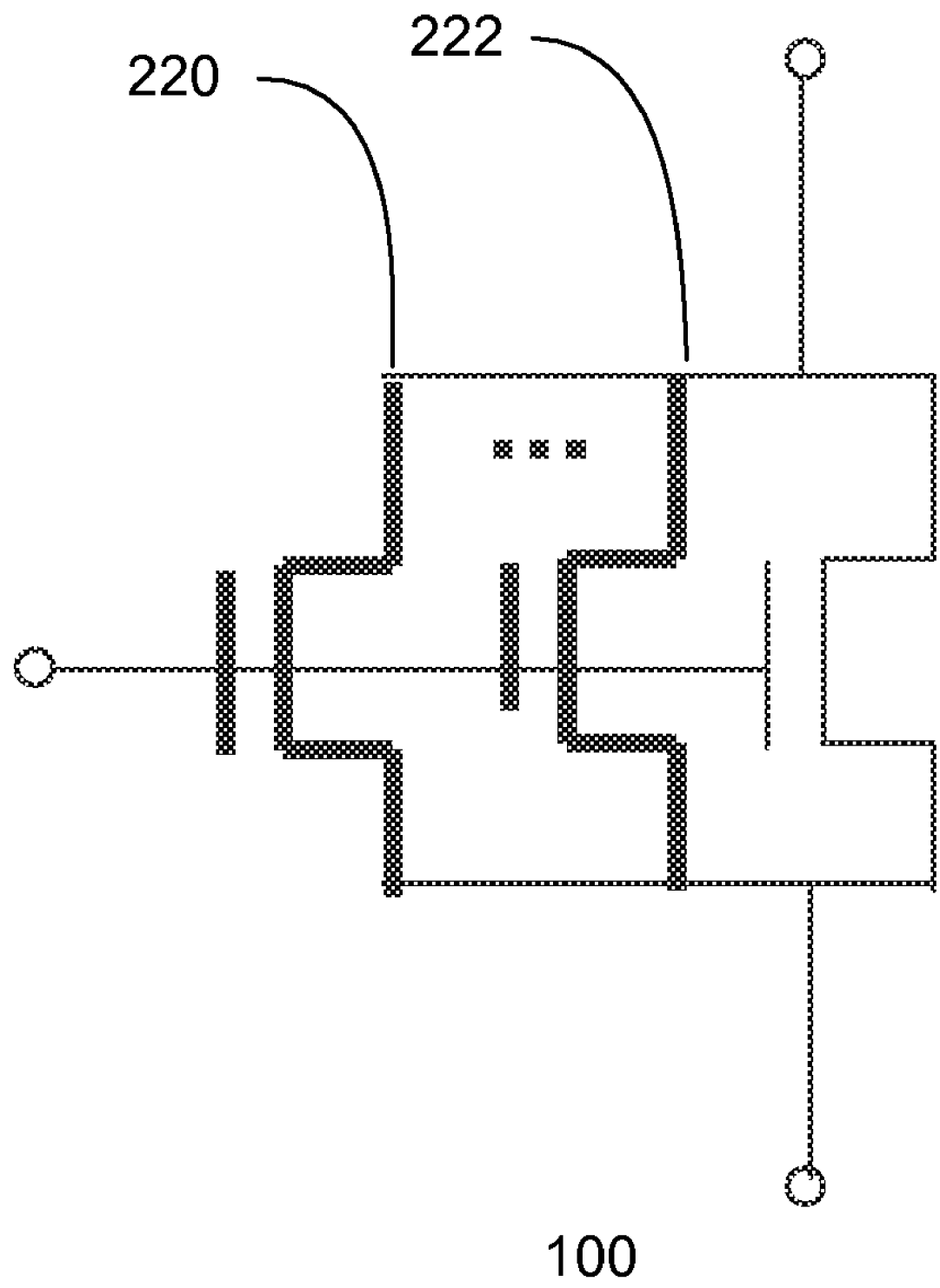
Figure 3:
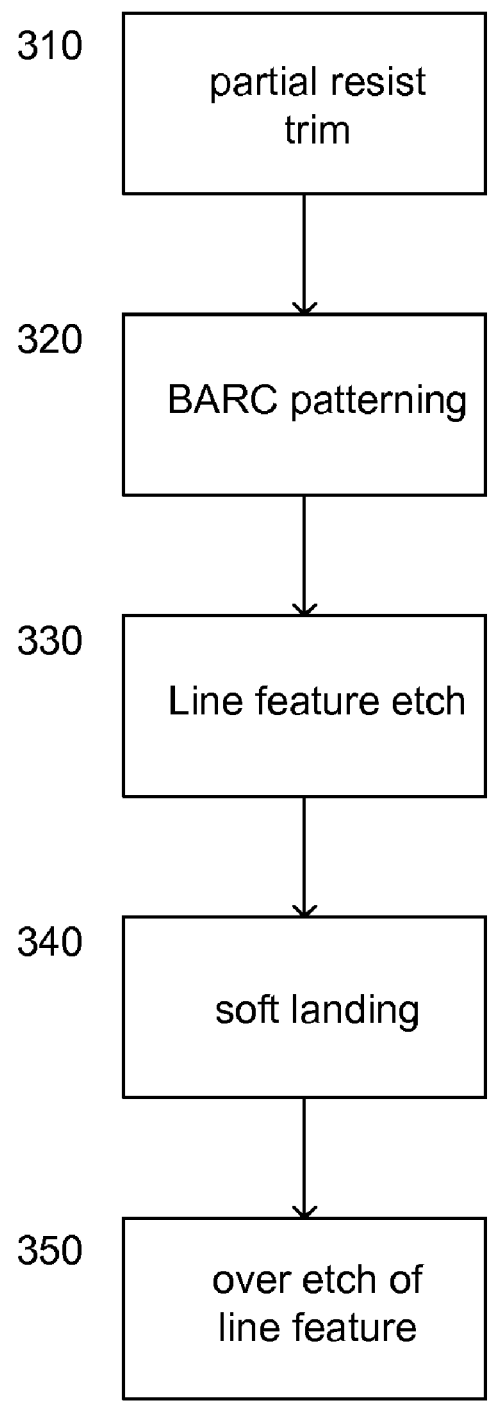
FIG. 3 shows a process for reducing LES in accordance with one embodiment of the invention.

FIG. 3 shows a process for reducing LES in accordance with one embodiment of the invention. The process includes providing a substrate having a patterned resist layer thereon. Typically a BARC layer is provided beneath the resist layer to improve the lithographic process. The patterned resist layer is used to form a sub-ground rule line feature. The difference between the ground rule and the desired CD of the line feature is referred to as the gap dimension (GD).

In one embodiment, the patterned resist layer is partially trimmed at step 310. The partial resist trim reduces the CD to sub-ground rule dimensions, but insufficiently to satisfy the desired CD of the line feature. The partial trim should result in LES ratio of less than 1.5, preferably less than 1.4, more preferably less than 1.3 and even more preferably, from about 1.1-1.2. The partial trim, for example, trims up to about 40% of the GD, preferably about 10-40% of the GD and more preferably about 20-30% of the GD. In one embodiment, the partial trim trims less than about 10 nm of the resist. The amount of resist trimming can be adjusted to accommodate different processes, so as to facilitate achieving the desired CD with low LES ratio. The partial resist trim can be performed using conventional $O_2$-based chemistry.

At step 320, exposed portions of the BARC layer unprotected by the resist layer are removed to expose portions of the layer beneath the BARC layer. The layer beneath the mask, in some applications, can include more than one layer. The layer stack at step 330 is patterned based on the resist mask to form a line feature. In accordance with one embodiment of the invention, the etch forms a line feature with the desired sub-ground rule CD. Unlike in resist trim processes, resist "foots" are not removed during the etch, thus reducing LES ratio. The etch comprises, in one embodiment, plasma etching. The etch employs appropriate chemistry for etching in the vertical direction with some etching in the horizontal direction. The desired ratio of vertical to horizontal etching (VE:HE) will depend on the height of the feature and the value of GD. The etch chemistry can be tailored to achieve the desired VE:HE ratio.

In one embodiment, the layer stack comprises layers for forming gate conductors. The gate conductor, for example, comprises a polysilicon layer over a gate dielectric layer. The gate dielectric layer comprises, for example, an oxide layer. Other types of line features are also useful. It is understood that the gate conductor need not be straight. The gate conductor can be S-shaped, L-shaped or other shapes. In one embodiment, a non-chlorine-based chemistry is used to etch the polysilicon layer. Using a non-chlorine based chemistry can reduce isotropic etching of the polysilicon sidewalls, minimizing profile bowing.

In one embodiment, the etch chemistry used to etch the polysilicon layer comprises first and second fluorine-based chemistries. The first chemistry comprises a high fluorine content while the second chemistry comprises a low fluorine/carbon ratio or high carbon content. The first chemistry etches the polysilicon layer while the second chemistry serves to passivate the polysilicon sidewalls to prevent bowing, maintaining the profile of the gate conductor. The first chemistry can comprise $SF_6$, $C_2F_6$ or $CF_4$ and the second chemistry can comprise $CH_2F_2$ or $C_4F_8$. Preferably, the first and second chemistries respectively comprise $SF_6$ and $CH_2F_2$. Alternatively, the first and second chemistries respectively comprise $SF_6$ and $C_4F_8$. The molar ratio of the first and second chemistries is about 1:1 to 1:3. Other types of fluorine-based or non-fluorine based chemistries may also be useful. The etch can be performed with low bias power and relatively high source power. Under these conditions, a high density, low bombardment energy plasma is formed such that a high etch rate can be achieved while minimizing the degree of plasma damage to the gate dielectric layer.

In one embodiment, the etch to form the line feature with the desired sub-ground rule CD stops with a soft landing at step 340. The soft landing step, for example, is highly selective to the gate dielectric material to reduce or eliminate pitting of the gate dielectric layer. After the soft landing step, an over-etch is performed at step 350. The over-etch, for example, has an even higher selectivity to the gate dielectric material to prevent damage to the gate dielectric layer.

Figure 4B:
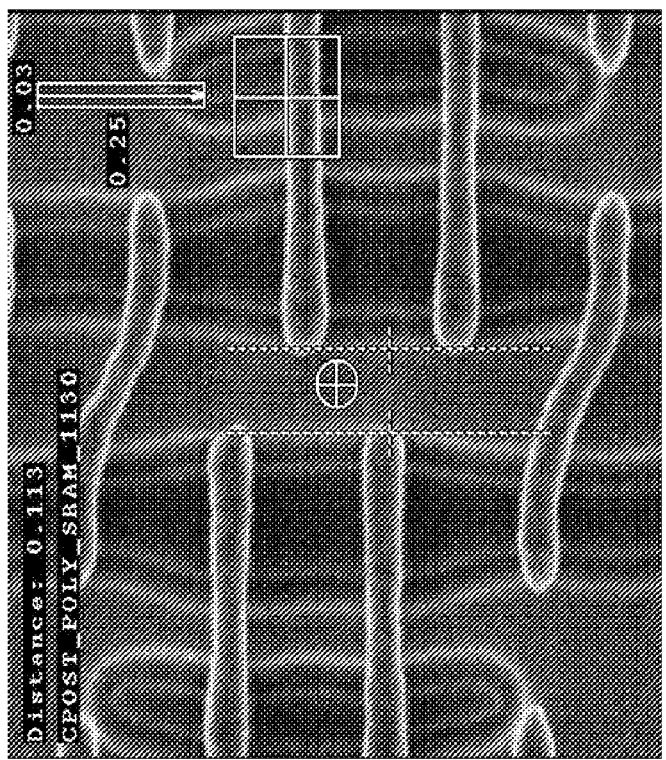
FIGS. 4a-b, respectively, show SEM images of gate conductors patterned in accordance with one embodiment of the invention and by conventional processes using a hard mask.
Figure 4A:
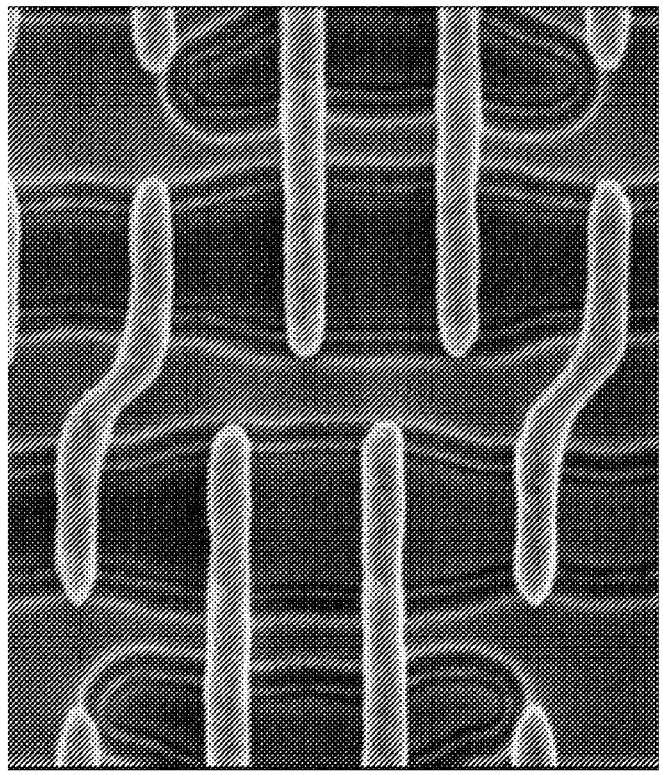

FIG. 4*a* shows a SEM image of gate conductors patterned in accordance with one embodiment of the invention, and FIG. 4*b* shows a SEM image of gate conductors patterned with a hard mask according to conventional processes. As shown in FIG. 4*a*, a LES ratio of about 1.2 can be achieved, with a polysilicon trim of about 30 nm. In contrast, as shown in FIG. 4*b*, conventional processes can only achieve a LES ratio of 2.4 with a smaller trim of 20 nm. As such, polysilicon line end pull back is significantly reduced using the present process. Additionally, with the present process, high functional yield, comparable to hard mask processes, was demonstrated for the fabrication of high density SRAM ICs.

As described, LES can be reduced by trimming the layer stack to achieve the desired CD during the etch to form the line feature. Furthermore, CD through pitch performance is improved because any microloading effect is counteracted by a greater reduction in line CD in isolated regions. Additionally, the present process is compatible with current STI/silicon nitride (SiN) liner schemes. It is thus readily integrated into existing processes with minimal expense in terms of both resources and developmental time. Finally, as compared with conventional hard mask processes, lower long-term production costs can be achieved.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A method for forming a device comprising:
providing a substrate prepared with a device layer formed thereon;
providing a mask layer above the device layer;
patterning the mask layer to produce a first pattern;
partially trimming the mask layer with the first pattern selectively to reduce a dimension of the first pattern to produce a trimmed mask with a second pattern with a reduced dimension, wherein the reduced dimension of the second pattern is an intermediate dimension larger than a desired dimension of a device feature, and comprises partially trimming the mask layer up to about 20-30% of a gap dimension, wherein the gap dimension is the difference between a ground rule and the desired dimension of the device feature; and
patterning the device layer with the trimmed mask layer using an etch comprises first and second patterning chemistries to form the device feature, wherein the first patterning chemistry comprises $SF_6$, $C_2F_6$ or $CF_4$, and the second patterning chemistry comprises $CH_2F_2$ or $C_4F_8$, the etch patterns the device layer and trims the device layer to form the device feature with the desired dimension which is smaller than the reduced dimension of the trimmed mask over the device feature, the trimming results in a reduced line end shortening (LES) ratio, wherein the LES ratio is about 1.1 to 1.2.

2. The method of claim 1 wherein the mask layer comprises a photoresist and the photoresist is trimmed using $O_2$ based chemistry.

3. The method of claim 1 wherein:
the mask layer comprises photoresist;
the device layer comprises a polysilicon layer over a dielectric layer; and
the patterned device layer comprises gate conductors.

4. The method of claim 3 wherein the gate conductors are etched and trimmed in the same process step using plasma and the chemistry for etching and trimming the gate conductors are tailored to achieve desired VE:HE ratio.

5. The method of claim 1 wherein the first patterning chemistry is $SF_6$ and the second patterning chemistry is $CH_2F_2$.

6. The method of claim 1 wherein the first patterning chemistry is $SF_6$ and the second patterning chemistry is $C_4F_8$.

7. A method of fabricating a semiconductor device comprising:
providing a semiconductor substrate prepared with a gate electrode layer;
forming and patterning a resist layer to produce a first resist pattern containing a pattern of the gate electrode layer;
partially trimming the resist layer selectively to reduce a dimension of the first resist pattern to produce a trimmed mask with a second resist pattern, wherein the dimension of the second resist pattern is an intermediate dimension smaller than the dimension of the first resist pattern but larger than a desired dimension of a gate conductor, and comprises partially trimming the mask layer up to about 20-30% of a gap dimension, wherein the gap dimension is the difference between a ground rule and the desired dimension of the gate conductor; and patterning the gate electrode layer with the trimmed mask using an etch comprises first and second patterning chemistries to form the gate conductor, wherein the first patterning chemistry comprises $SF_6$, $C_2F_6$ or $CF_4$, and the second patterning chemistry comprises $CH_2F_2$ or $C_4F_8$, the etch patterns the gate electrode layer and trims the gate electrode layer to form the gate conductor with the desired dimension which is smaller than the intermediate dimension of the trimmed mask over the gate conductor, the trimming results in a reduced LES ratio, wherein the LES ratio is about 1.1 to 1.2.

8. The method of claim 7 wherein the resist layer is trimmed using $O_2$ based chemistry, the gate electrode layer is etched and trimmed in the same process step using plasma, and the chemistry for etching and trimming the gate electrode layer are tailored to achieve desired VE:HE ratio.

9. A method for forming a device comprising:
providing a substrate prepared with a device layer formed thereon;
providing a mask layer above the device layer and patterning the mask layer to form a first resist pattern;
partially trimming the mask layer selectively to reduce a dimension of the first resist pattern to produce a trimmed mask with a second mask pattern with an intermediate dimension smaller than the dimension of the first resist pattern but which is larger than a desired dimension of a device feature, and comprises partially trimming the mask layer up to about 20-30% of a gap dimension, wherein the gap dimension is the difference between a ground rule and the desired dimension of the device feature; and
patterning the device layer with the trimmed mask using an etch comprises first and second patterning chemistries to form the device feature, wherein the first patterning chemistry comprises $SF_6$, $C_2F_6$ or $CF_4$, and the second patterning chemistry comprises $CH_2F_2$ or $C_4F_8$, the etch patterns the device layer and trims the device layer to form the device feature with the desired dimension which is smaller than the intermediate dimension of the trimmed mask over the device feature, the patterning/trimming results in a reduced line end shortening (LES) ratio, wherein the LES ratio is about 1.1 to 1.2.

10. The method of claim 9 wherein the mask layer comprises photoresist.

11. The method of claim 10 wherein patterning the device layer comprises:
a soft landing which is highly selective to a gate dielectric layer; and
an over-etch.

12. The method of claim 9 wherein:
the mask layer comprises photoresist;
the device layer comprises multiple layers of a gate stack which include a gate electrode layer over a gate dielectric layer; and
the desired feature comprises a gate conductor.

13. The method of claim 12 wherein patterning the device layer comprises:
a soft landing which is highly selective to the gate dielectric layer; and
an over-etch.

14. The method of claim 9 wherein patterning the device layer trims the device layer to the desired dimension.

15. The method of claim 9 wherein the first patterning chemistry is $SF_6$ and the second patterning chemistry is $CH_2F_2$.

16. The method of claim 9 wherein the first patterning chemistry is $SF_6$ and the second patterning chemistry is $C_4F_8$.

17. A method for forming a device comprising:
providing a substrate prepared with a device layer formed thereon;
providing a resist layer above the device layer;
patterning the resist layer to produce a first pattern;
partially trimming the resist layer with the first pattern selectively to reduce a dimension of the first pattern to produce a trimmed mask with a second pattern with a reduced dimension, wherein the reduced dimension of the second pattern is an intermediate dimension larger than a desired dimension of a device feature, and comprises partially trimming the resist layer up to about 20-30% of a gap dimension, wherein the gap dimension is the difference between a ground rule and the desired dimension of the device feature; and
patterning the device layer with the trimmed mask using an etch comprises first and second patterning chemistries to form the device feature, wherein the first patterning chemistry comprises $SF_6$, $C_2F_6$ or $CF_4$, and the second patterning chemistry comprises $CH_2F_2$ or $C_4F_8$, patterning the etch patterns the device layer and trims the device layer to form the device feature with the desired dimension which is smaller than the reduced dimension of the trimmed mask over the device feature, the trimming results in a reduced line end shortening (LES) ratio, wherein the LES ratio is about 1.1 to 1.2, wherein the device layer is etched and patterned in the same process step using plasma, and the chemistry for etching and trimming the device layer gate conductor are tailored to achieve desired VE:HE ratio.

* * * * *